(12) United States Patent
Müller et al.

(10) Patent No.: US 11,521,946 B2
(45) Date of Patent: Dec. 6, 2022

(54) METHOD FOR TEMPORARILY FASTENING A SEMICONDUCTOR CHIP TO A SURFACE, METHOD FOR PRODUCING A SEMICONDUCTOR COMPONENT AND SEMICONDUCTOR COMPONENT

(71) Applicant: OSRAM OLED GmbH, Regensburg (DE)

(72) Inventors: Klaus Müller, Pettendorf (DE); Holger Klassen, Regenstauf (DE); Matthias Hofmann, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 29 days.

(21) Appl. No.: 17/057,036

(22) PCT Filed: Jun. 3, 2019

(86) PCT No.: PCT/EP2019/064322
§ 371 (c)(1),
(2) Date: Nov. 19, 2020

(87) PCT Pub. No.: WO2019/238452
PCT Pub. Date: Dec. 19, 2019

(65) Prior Publication Data
US 2021/0183800 A1    Jun. 17, 2021

(30) Foreign Application Priority Data
Jun. 12, 2018   (DE) .......................... 102018114013.4

(51) Int. Cl.
*H01L 23/00* (2006.01)
*H01L 33/62* (2010.01)

(52) U.S. Cl.
CPC .............. *H01L 24/11* (2013.01); *H01L 24/13* (2013.01); *H01L 24/16* (2013.01); *H01L 24/81* (2013.01);
(Continued)

(58) Field of Classification Search
None
See application file for complete search history.

(56) References Cited

U.S. PATENT DOCUMENTS 5,611,481 A    3/1997   Akamastsu et al.
6,127,735 A   10/2000   Berger et al.
(Continued)

FOREIGN PATENT DOCUMENTS

EP    0747954 A2   12/1996
EP    2328192 A2    6/2011
(Continued)

OTHER PUBLICATIONS

Shin, S.W., et al., "Creep Deformation of Microstructurally Stable Sn—3.5Ag—xBi solders," IEEE, 2001 Int'l Symposium an Electronic Materials and Packaging, Nov. 19-21, 2001, 6 pages.

*Primary Examiner* — Long Pham
(74) *Attorney, Agent, or Firm* — Slater Matsil, LLP (57) ABSTRACT

In an embodiment a method for producing a semiconductor component comprising at least one semiconductor chip mounted on a surface, wherein the semiconductor chip is fixed on the surface by applying a solder compound to an assembling surface of the semiconductor chip, applying a metallic adhesive layer to a side of the solder compound facing away from the assembling surface, preheating the surface to a first temperature T1, bringing the metallic adhesive layer into mechanical contact in a solid state with the preheated surface, the metallic adhesive layer at least partially melting while it is brought into mechanical contact
(Continued)

with the preheated surface, and subsequently cooling the surface to room temperature, the semiconductor chip being at least partially metallurgically bonded to the surface, and wherein the semiconductor chip is subsequently soldered to the surface to form a resulting solder connection.

20 Claims, 4 Drawing Sheets

(52) U.S. Cl.
CPC ....... *H01L 33/62* (2013.01); *H01L 2224/1145* (2013.01); *H01L 2224/11462* (2013.01); *H01L 2224/13023* (2013.01); *H01L 2224/13083* (2013.01); *H01L 2224/13109* (2013.01); *H01L 2224/13111* (2013.01); *H01L 2224/13155* (2013.01); *H01L 2224/13166* (2013.01); *H01L 2224/16238* (2013.01); *H01L 2224/81048* (2013.01); *H01L 2224/81097* (2013.01); *H01L 2224/81191* (2013.01); *H01L 2224/81805* (2013.01); *H01L 2224/81815* (2013.01); *H01L 2224/81907* (2013.01); *H01L 2924/12041* (2013.01); *H01L 2933/0066* (2013.01)

(56) References Cited

U.S. PATENT DOCUMENTS

| 6,794,202 | B2 | 9/2004 | Beroz et al. |
| 2007/0141750 | A1 | 6/2007 | Iwasaki et al. |
| 2007/0284738 | A1* | 12/2007 | Shimoishizaka ............... H01L 23/49816 174/250 |
| 2009/0137082 | A1* | 5/2009 | Kurita ................ H01L 25/0657 228/141.1 |
| 2014/0027418 | A1 | 1/2014 | Azdasht |

FOREIGN PATENT DOCUMENTS

| EP | 2677557 A1 | 12/2013 |
| EP | 2688093 A1 | 1/2014 |
| WO | 2014022619 A2 | 2/2014 |

* cited by examiner

METHOD FOR TEMPORARILY FASTENING A SEMICONDUCTOR CHIP TO A SURFACE, METHOD FOR PRODUCING A SEMICONDUCTOR COMPONENT AND SEMICONDUCTOR COMPONENT

This patent application is a national phase filing under section 371 of PCT/EP2019/064322, filed Jun. 3, 2019, which claims the priority of German patent application 102018114013.4, filed Jun. 12, 2018, each of which is incorporated herein by reference in its entirety.

TECHNICAL FIELD

A method for fixing a semiconductor chip on a surface, a method of producing a semiconductor component and a semiconductor component are provided.

SUMMARY

Embodiments provide an improved method for fixing a semiconductor chip on a surface. Other embodiments provide an improved method for producing a semiconductor component. Further embodiments provide a semiconductor component with improved properties.

A method for fixing a semiconductor chip on a surface is specified. Here and in the following, "fixing" is to be understood to mean that a preliminary fastening is achieved with the method, which can serve as a preliminary stage to a permanent fixing, for example by means of soldering.

The semiconductor chip can be an optoelectronic semiconductor chip such as an LED chip, for example.

In accordance with an embodiment, a solder compound is applied to an assembling surface of the semiconductor chip in this method. The assembling surface of the semiconductor chip is understood to be the area of the semiconductor chip which is to be applied to the surface. The assembling surface can therefore also include one or more connection pads, which are present on the side of the semiconductor chip with which the semiconductor chip is to be fixed to the surface. The solder compound can be applied in the form of a layer to the assembling surface.

Here and in the following, a solder compound is understood to be a material suitable for soldering. This can be either pure metal or an alloy. The solder compound can be deposited directly on the wafer.

According to another embodiment, a metallic adhesive layer is applied to the side of the solder compound facing away from the assembling surface. The metallic adhesive layer can be applied over the entire area of the solder compound. Here and in the following, a metallic adhesive layer is to be understood as a layer containing a material that develops a fixing effect, possibly under the influence of increased temperature. The fixing or adhesive effect can be caused by surface tension, for example, and makes it possible to hold the semiconductor chip in position on the surface.

According to another embodiment, the surface is preheated to a temperature T1. This means that the surface to which the semiconductor chip is to be applied is heated before the semiconductor chip is applied, whereby the temperature T1 comprises a temperature that is higher than room temperature.

According to another embodiment, the metallic adhesive layer is brought into mechanical contact with the preheated surface, whereby the metallic adhesive layer melts at least partially during the bringing in mechanical contact with the preheated surface. The metallic adhesive layer is thus brought into contact with the surface in a solid state and melts at least partially when it comes into contact with the preheated surface. Due to the increased temperature T1 of the surface, the metallic adhesive layer is subjected to a temperature effect, which causes it to melt at least partially and thus develop its adhesive effect. By selectively adjusting the temperature T1 of the surface, the metallic adhesive layer can thus be brought into an at least partially liquid state, so that the surface can be at least partially wetted by the metallic adhesive layer. The adhesive effect is thus initially based on the surface tension of the at least partial melt of the metallic adhesive layer.

Furthermore, the surface can have surface pads with which the metallic adhesive layer is brought into mechanical contact. The preheating of the surface then also includes preheating the surface pads. Here and in the following, the term "surface" should also be understood to mean a surface with surface pads, even if this is not mentioned separately. If the assembling surface also includes connection pads, the assembling surface is applied to the surface in such a way that connection pads and surface pads face each other and—after soldering downstream of the process—can form a contact between semiconductor chip and surface.

According to another embodiment, the surface is subsequently cooled to room temperature, whereby the semiconductor chip is at least partially metallurgically bonded to the surface. Thus, the metallic adhesive layer can at least partially melt by contacting the preheated surface, whereupon the semiconductor chip is fixed on the surface by means of surface tension, after cooling and the resulting solidification of the metallic adhesive layer, the adhesive effect is based on metallurgical bonding, which ensures the fixation of the semiconductor chip on the surface.

According to another embodiment, a method for fixing a semiconductor chip on a surface is specified, wherein a solder compound is applied to an assembling surface of the semiconductor chip, a metallic adhesive layer is applied to the side of the solder compound facing away from the assembling surface, the surface is preheated to a temperature T1, the metallic adhesive layer is brought into mechanical contact with the preheated surface, the metallic adhesive layer at least partially melting during the bringing in mechanical contact with the preheated surface, and the surface is subsequently cooled to room temperature, the semiconductor chip being at least partially metallurgically bonded to the surface.

This process can advantageously dispense with the use of organic fluxes or adhesive media and thus basically avoids organic contamination in the later component. This also avoids costly cleaning processes.

In the industrially common chip assembly, a flux with a certain adhesive effect is used to hold the semiconductor chip in position until the actual soldering process. However, the flux residues must usually be removed by a downstream wet chemical cleaning process. The flux residues are often difficult to access for the cleaning medium, which makes it extremely difficult to control the cleaning effect. Such residues can also hinder the binding of materials to be applied later, for example filler materials, and thus impair their stabilizing effect.

Alternatively, temporary adhesive media without flux effect are conventionally used, but these only have a temporary limited adhesive effect. It must be ensured from a process engineering point of view that such adhesive media can evaporate without residue, as otherwise undesirable interactions with the soldering process could occur.

With the method described here, such organic contaminations and the resulting cleaning processes can be avoided, which can lead to easier processes and qualitatively improved components.

According to another embodiment, the metallic adhesive layer has a solidus temperature which is ≤T1. Solidus temperature here and in the following is to be understood as the temperature of a metal or alloy at which it begins to melt. If the metallic adhesive layer has a solidus temperature, which is ≤T1, the adhesive layer can thus at least partially melt when it is brought into contact with the preheated surface. If the solidus temperature of the metallic adhesive layer is designated S1, the following can apply: S1≤T1≤S1+30° C. In this temperature range, the at least partial melting of the metallic adhesive layer can be achieved and additional melting of the solder compound can be avoided.

In particular, the composition of the metallic adhesive layer can be selected to have a wide melting range. This includes a large distance between the solidus temperature Si and the liquidus temperature, the temperature at which the material melts completely.

According to another embodiment, the solder compound has a solidus temperature which is >T1. Such a temperature enables the solder compound to remain in a solid state during the metallurgical bonding of the metallic adhesive layer to the surface.

In another embodiment, a barrier layer is applied between the solder compound and the metallic adhesive layer. Such a barrier layer can prevent the materials of the solder compound and the metallic adhesive layer from mixing, for example by diffusion. Therefore, the barrier layer can also be called a release layer.

According to another embodiment, the solder compound comprises or consists of Sn or a Sn-based alloy. A Sn-based alloy is to be understood here and in the following as an alloy which contains Sn as its main component. Such alloys can be SnAg or SnAgCu, for example. The alloy SnAg can contain for example Ag with a proportion of 1 to 4 mass %.

According to another embodiment, the metallic adhesive layer comprises a material that is selected from a group consisting of SnIn, SnBi and In. Such metals or alloys can easily form a partial melt or melt in the process to hold and fix the semiconductor chip in position on the surface by means of surface tension.

According to another embodiment, the barrier layer comprises a material selected from a group consisting of Ti and Ni. Layers of such materials are particularly good at preventing diffusion of the materials of the solder compound and the metallic adhesive layer and can be dissolved at the same time in a soldering step following the process.

According to a further embodiment, the solder compound is electroplated on the assembling surface. Furthermore, the solder compound can be deposited in a thickness selected from the range 20 μm to 50 μm.

In another embodiment, the metallic adhesive layer is vapour-deposited or sputtered on. Furthermore, the metallic adhesive layer can be deposited in a thickness selected from the range 1 μm to 5 μm.

Thus, the thickness of the metallic adhesive layer is approximately one order of magnitude smaller than that of the solder compound. This leads to a volume fraction of the metallic adhesive layer in the total solder volume of the solder compound and metallic adhesive layer which is sufficiently small to reliably prevent premature melting of a solder compound resulting after a soldering step following the method. On the other hand, the additional alloy component, which the metallic adhesive layer contributes to the resulting solder compound, can also be used selectively to improve the strength properties of the resulting solder compound. For example, the creep resistance of the resulting solder compound can be significantly increased by using a SnBi alloy as a metallic adhesive layer. For this purpose, a resulting Bi content of 2 to 3 wt % would be useful.

According to another embodiment, the barrier layer is vapour-deposited or sputtered on. Furthermore, the barrier layer can be applied in a thickness selected from the range 10 μm to 50 μm. For example, a barrier layer containing Ti or consisting of Ti can be 10 μm to 50 μm thick or a barrier layer containing Ni or consisting of Ni can be 10 μm to 50 μm thick. The ranges for the thickness of a barrier layer ensure sufficient density of the barrier layer to prevent diffusion between the metallic adhesive layer and the solder compound.

According to another embodiment, the surface comprises an assembling surface of a printed circuit board or of a housing. Thus, for example, a semiconductor chip can be fixed to a printed circuit board and then soldered in a subsequent process.

The method can also be used to fix several semiconductor chips one after the other on a surface before they are all soldered together on the surface, which can also be described as "mass reflow". While the semiconductor chips are fixed one after the other on the surface with the method described here, the temperature T1 is low enough to have no damaging effect on the already fixed semiconductor chips.

A method of producing a semiconductor component comprising at least one semiconductor chip mounted on a surface is further specified, in which a semiconductor chip is fixed on a surface in accordance with a method according to the above embodiments, and then the semiconductor chip is soldered to the surface to form a resulting solder compound.

This method thus produces a permanent solder connection from a metallurgical bond obtained by the above method for fixing a semiconductor chip on a surface. All the features described in connection with the above method thus also apply to the method of producing the semiconductor component and vice versa.

Here and in the following, a resulting solder compound is to be understood as a material that is an alloy, in particular a homogeneous alloy, of the materials of the solder compound and the metallic adhesive layer. If a barrier layer is present, particles of the dissolved material of the barrier layer are further present in the resulting solder compound.

In the method of producing a semiconductor component, the pressure-loaded attachment process, i.e. the bringing in mechanical contact of the metallic adhesive layer with the preheated surface, is thus decoupled from the pressure-free soldering process. This can prevent solder from being crushed. Furthermore, by means of the method for fixing a semiconductor chip on a surface, a large number of semiconductor chips can also be applied and fixed on the surface one after the other, and the large number of semiconductor chips can then be soldered simultaneously. Thus only the temperature T1 acts on the semiconductor chips during the method for fixing, the duration of the effect of the soldering temperature, which is higher than T1, is the same for all semiconductor chips and is comparatively short.

Conventionally, semiconductor chips are often applied by sequential soldering, which leads to the problem that at least a larger area of the surface or the entire surface must be heated to process temperature. Thus, the duration of the temperature effect on the semiconductor chips and thus also on the solder compounds basically depends on the position on the surface. For example, the first semiconductor chip that is placed remains at soldering temperature until the last semiconductor chip has also been placed and soldered on the surface and the surface as a whole is cooled down. The higher the packing density on the surface, the greater is this effect.

With the method of producing a semiconductor component described here, it is thus possible to temporarily fix the semiconductor chips during the assembly process at a comparatively low temperature in order to solder them together in a subsequent process step and only briefly expose them to the high soldering temperature.

According to another embodiment, the soldering is carried out in a reducing atmosphere. The reducing atmosphere can be produced, for example, by means of forming gas or formic acid.

According to another embodiment, the soldering is carried out at a temperature T2 which is greater than or equal to liquidus temperature of the solder compound. T2 is also greater than or equal to the liquidus temperature of the metallic adhesive layer. This ensures that the solder compound and the metallic adhesive layer melt completely and, in addition, the metallic adhesive layer is completely mixed with the solder compound to form a homogeneous alloy. If the liquidus temperature of the solder compound is designated L2, the following may apply: $L2 \leq T2 \leq L2+20°$ C. This keeps the solder temperature low enough to avoid damaging the semiconductor component.

Because the melting of the solder compound and the metallic adhesive layer is pressure-free, the self-centering effect of the semiconductor chip or connection pad to the surface or surface pad can be utilized due to the surface tension of the resulting liquid solder compound. Due to this effect, a low placement accuracy during the method for fixing the semiconductor chip can be tolerated and smaller distances between the connection pads, i.e. the contacts, can be realized.

If there is a barrier layer between the solder compound and the metallic adhesive layer, this is dissolved during soldering. NiSn or TiSn phases, for example, can then be formed as particles within the resulting solder compound.

According to another embodiment, during soldering the solder compound and the metallic adhesive layer are completely melted and a resulting solder compound is formed, which comprises an alloy that differs in composition from the solder compound and the metallic adhesive layer. The alloy composition of the resulting solder compound can be specifically influenced by adjusting the volume fraction and composition of the metallic adhesive layer to the volume and the composition of the solder compound.

Furthermore, a semiconductor component is specified which has at least one semiconductor chip mounted on a surface and which is produced by a method of producing a semiconductor component according to the above specifications. All characteristics relating to the method of producing a semiconductor component thus also apply to the semiconductor component and vice versa.

BRIEF DESCRIPTION OF THE DRAWINGS

Further advantages, preferred embodiments and further developments of the methods and the semiconductor component result from the exemplary embodiments explained below in connection with the figures.

DETAILED DESCRIPTION OF ILLUSTRATIVE EMBODIMENTS

In the exemplary embodiments and figures, the same or similarly acting components are each provided with the same references. The components shown and the proportions of the components to each other are not to be regarded as true to scale. Rather, some details of the figures are shown in exaggerated size for better understanding.

Figure 1A:
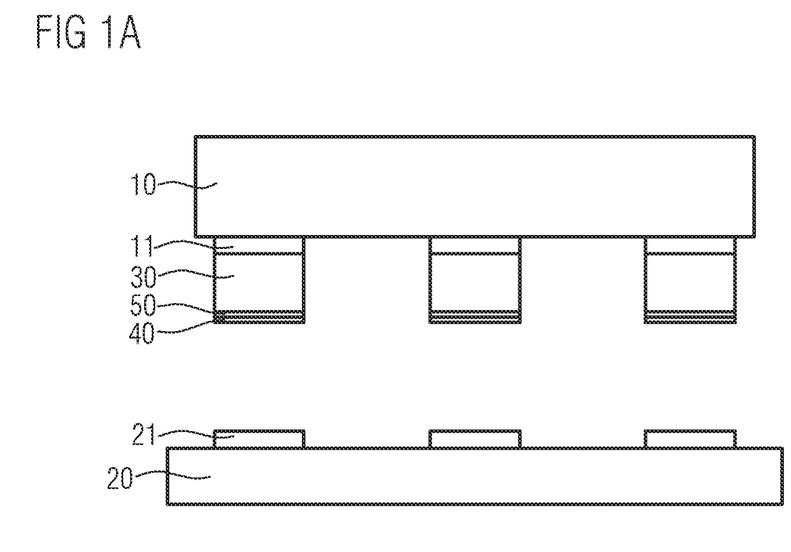
FIGS. 1A to 1C show schematic sectional views of method steps in the method for fixing a semiconductor chip on a surface.

FIG. 1A shows a schematic sectional view of a semiconductor chip 10 to be applied to a surface 20. On the surface 20, which can be a printed circuit board, for example, there are surface pads 21 on which the semiconductor chip 10 is to be attached. The assembling surface of the semiconductor chip 10 comprises connection pads 11, on each of which in turn a solder compound 30, a barrier layer 50 and a metallic adhesive layer 40 are applied. The barrier layer 50 is optional and, depending on the composition of the solder compound 30 and the metallic adhesive layer 40, not absolutely necessary. The solder compound 30, e.g. SnAg, is electroplated on the connection pads 11 in a thickness of 20 m to 50 µm. The barrier layer 50 and the metallic adhesive layer 40 are each vapour-deposited or sputtered on. The barrier layer 50 has a thickness of 10 to 50 µm, the metallic adhesive layer has a thickness of about 1 to 5 µm. For example, Ti or Ni can be deposited as barrier layer 50. An InSn or BiSn alloy, for example, can be applied as metallic adhesive layer 40. In the case of InSn as a metallic adhesive layer, a barrier layer 50 is required, as Sn and In itself easily mix, which should be avoided.

It is also conceivable to apply the solder compound 30, optionally the barrier layer 50, and the metallic adhesive layer 40 directly to an assembling surface of the semiconductor chip 10 if no connection pads 11 are present, and to bring the metallic adhesive layer 40 into contact with the surface 20 if no surface pads 21 are present (not shown here).

The ratio of In to Sn or Bi to Sn in the metallic adhesive layer determines the seeked temperature T1 to which the surface 20 must be preheated. For example, the temperature T1 is 140° C. at about 60 wt % In or about 170° C. at about 80 wt % In. If a SnBi alloy is applied as the metallic adhesive layer 40, the vapour deposition or sputtering of a barrier layer 50 is not absolutely necessary, since Sn and Bi only mix homogeneously at elevated temperature. Also in this case, the ratio Bi to Sn used to determine the temperature T1. For example, at about 30 wt % Bi, Ti=150° C., at about 10 wt % Bi it is 190° C.

Figure 1B:
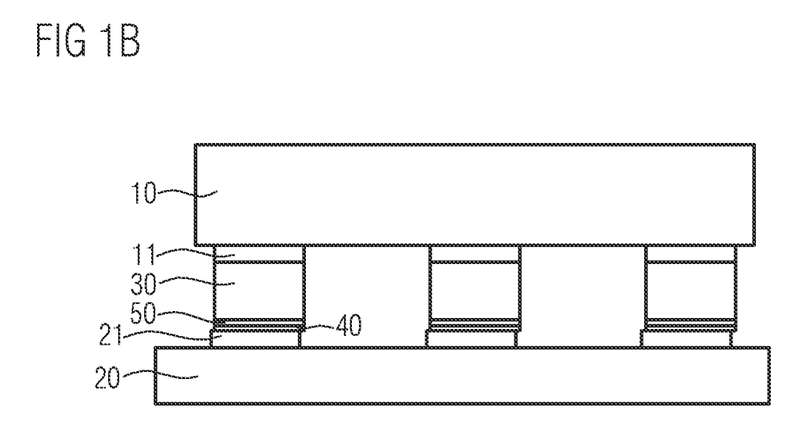

FIG. 1B shows a schematic sectional view of the application of the semiconductor chip 10 on the surface 20, in which the metallic adhesive layer 40 is brought into mechanical contact with the surface pads 21. The connection pads 11 and the surface pads 21 are thus largely opposite each other. As can be seen in FIG. 1B, a low placement accuracy is tolerable, i.e. the connection pads 21 and the surface pads 11 do not have to be placed exactly congruently one above the other. When the solder compound 30 and the metallic adhesive layer 40 are melted in the subsequent method of producing a semiconductor component, the surface tension ensures a self-centering effect of the semiconductor chip 10 to the surface pad 21.

Figure 1C:
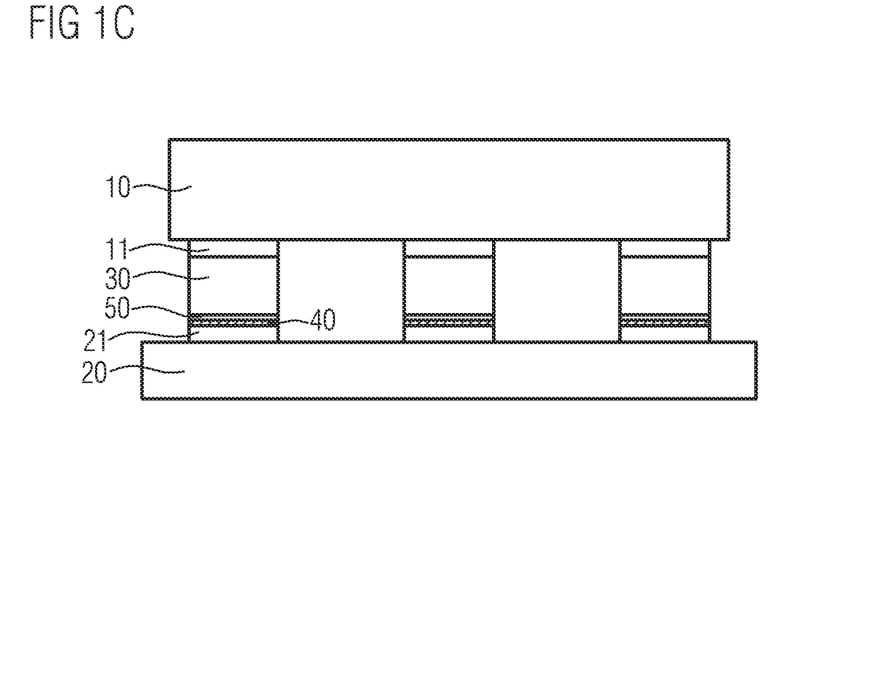

Since the surface 20 and thus also the surface pads 21 are preheated to the temperature T1, an at least partial melting of the metallic adhesive layer 40 takes place, which is indicated in FIG. 1C in a schematic sectional view by the hatching of the metallic adhesive layer 40. As a result, the surface 20 is at least partially wetted by the metallic adhesive layer 40. As long as the surface 20 is heated to temperature T1, the adhesive effect of the metallic adhesive layer 40 is based on the surface tension of the at least partially formed melt. If the surface 20 is then cooled down to room temperature, the metallic adhesive layer 40 solidifies and an at least limited metallurgical bond is created where the surface pads 21 were wetted with the partial melt of the metallic adhesive layer 40.

Figure 2:
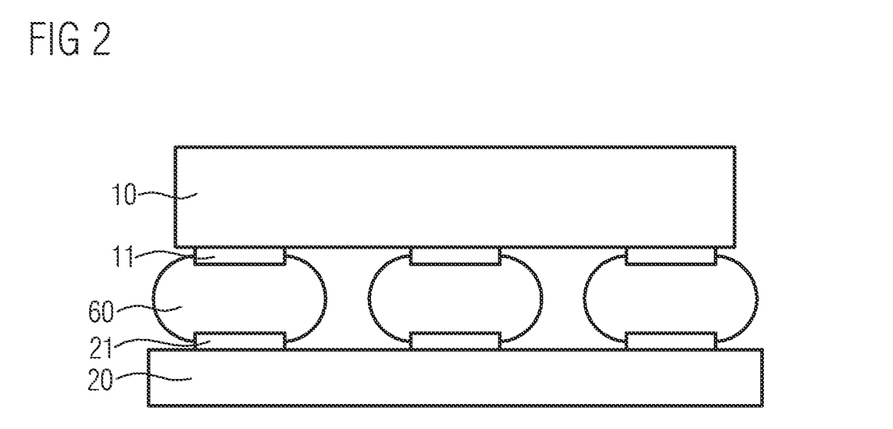
FIG. 2 shows a schematic sectional view of a method step in the method for producing a semiconductor component.

FIG. 2 shows a schematic sectional view of a semiconductor component after the method of producing a semiconductor component, in which the metallurgical bond obtained by the method for fixing a semiconductor chip on a surface is soldered and a resulting solder compound 60 is formed.

The soldering takes place at a temperature T2 at which both the metallic adhesive layer 40 and the solder compound 30 are completely melted and form an alloy, the resulting solder compound 60. If the barrier layer 50 is present, it also dissolves during soldering and forms phases within the resulting solder compound 60. The pressure-free melting of the solder compound 30 and the metallic adhesive layer 40, i.e. the complete solder volume, results in a self-centering effect from connection pad 11 to surface pad 21 due to the surface tension of the resulting solder compound 60. This compensates or corrects placement inaccuracies during the fixing of the semiconductor chip 10 on surface 20. For example, if the distance from the center of one connection pad 11 or surface pad 21 to the center of the next connection pad 11 or surface pad 21 is 50 μm, a placement inaccuracy of up to 10 μm can be tolerated when fixing the semiconductor chip 10 on the surface 20, as it can be corrected by the self-centering effect due to the surface tension of the resulting solder compound 60. In conventional processes, a placement inaccuracy of at most 5 μm is acceptable.

Figure 3A:
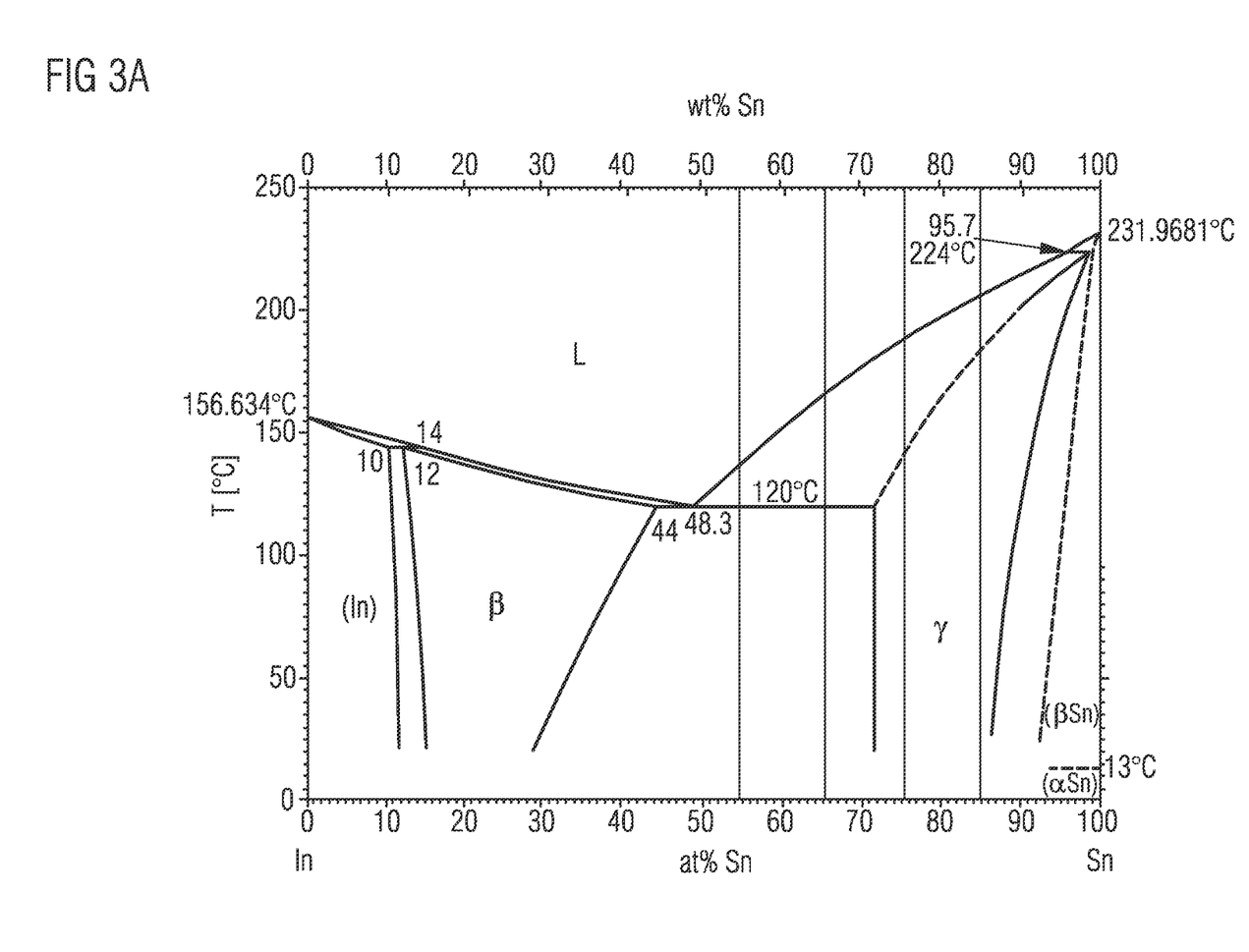
FIGS. 3A and 3B show state diagrams of materials of the metallic adhesive layer.

FIG. 3A shows a state diagram of the system SnIn, which can be used as metallic adhesive layer 40. On the y-axis the temperature T is given in ° C., the x-axis indicates the proportion of Sn in the system in atomic percent at % or weight percent wt %. Following this state diagram, three compositions of SnIn result, which can be used as metallic adhesive layer 40. On the one hand, a SnIn alloy with about 80±5 wt % In can be used as metallic adhesive layer. This requires a barrier layer 50 between the metallic adhesive layer 40 and the solder compound 30 to prevent a mixture of the solder compound 30 and the metallic adhesive layer 40 before the later soldering. In the method for fixing the semiconductor chip 10 on the surface 20, a temperature T1 of 160° C. to 190° C. is used, since the solidus temperature of the SnIn alloy is between 150° C. and 180° C. In the resulting solder compound 60, there is then a low content of indium than in the metallic adhesive layer 40, since the volume of the metallic adhesive layer 40 is about one order of magnitude smaller than that of solder compound 30.

Another possibility is the use of a SnIn alloy with a content of 60±5 wt % of indium. Here, too, a barrier layer 50 between the solder compound 30 and the metallic adhesive layer 40 may be necessary to prevent the materials from mixing. An at least partial melting of the metallic adhesive layer 40 is then achieved at a temperature T1 of >120° C. In particular, a Ti from the range 130° C. to 150° C. can be used.

As a third possibility, the use of pure In could also be considered.

Figure 3B:
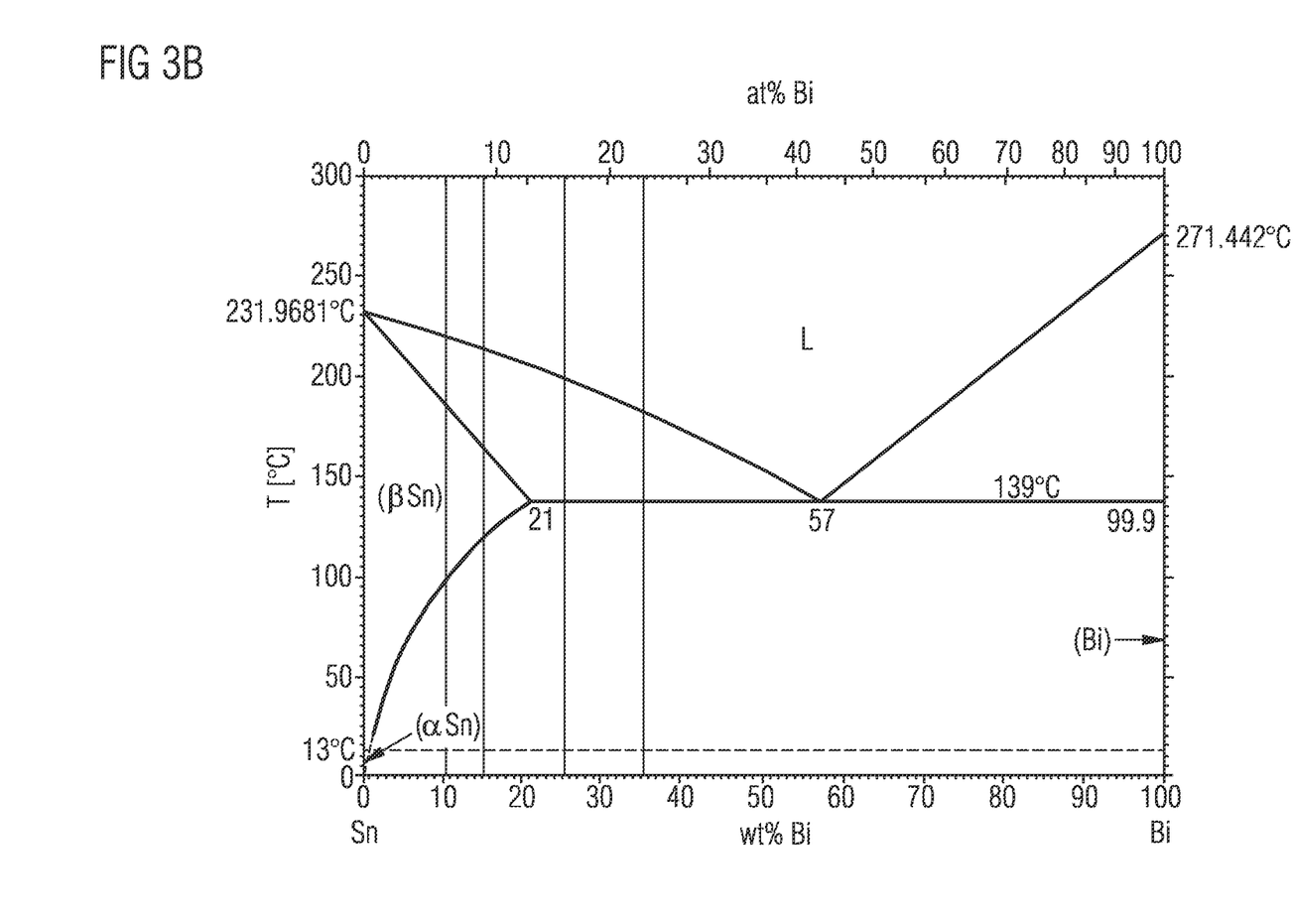

FIG. 3B shows the state diagram of SnBi, which can be used as metallic adhesive layer 40. The y-axis shows the temperature T in ° C., the x-axis indicates the proportion of Bi in the system in atomic percent at % or weight percent wt %. In this system, there are two possibilities of use as metallic adhesive layer 40.

On the one hand, a SnBi alloy with a proportion of Bi of 10 to 15 wt % can be used. A barrier layer 50 to prevent diffusion between the solder compound 30 and the metallic adhesive layer 40 should also be used here. The solidus temperature of this system is 170° C. to 190° C., which means that the temperature T1 used in the process for preheating the surface 20 is advantageously selected from the range 180° C. to 200° C. The resulting solder compound 60 then has a lower Bi-content than the metallic adhesive layer 40.

Furthermore, a SnBi alloy with a Bi content of 30±5 wt % can also be used to form a metallic adhesive layer 40. A partial melting of the metallic adhesive layer 40 can then be achieved at a temperature of >138° C., whereby Ti is advantageously selected between 140° C. and 160° C. In this case, a barrier layer 50 can be dispensed with, since SnBi only mix homogeneously at elevated temperature due to the strongly curved solubility line.

The total Bi-content in the resulting solder compound 60 after soldering should not exceed 4 wt % to avoid the risk of local melting. On the other hand, the presence of Bi significantly increases the creep resistance in the resulting solder compound 60, which can increase the temperature resistance, especially during extreme temperature fluctuations (temperature cycling).

The invention is not limited by the description based on the exemplary embodiments to these. Rather, the invention includes any new feature or combination of features, which includes in particular any combination of features in the claims, even if that feature or combination itself is not explicitly mentioned in the claims or exemplary embodiments.

The invention claimed is:

1. A method for producing a semiconductor component comprising at least one semiconductor chip mounted on a surface, wherein the semiconductor chip is fixed on the surface by:
    applying a solder compound to an assembling surface of the semiconductor chip,
    applying a metallic adhesive layer to a side of the solder compound facing away from the assembling surface,
    preheating the surface to a first temperature T1,
    bringing the metallic adhesive layer into mechanical contact in a solid state with the preheated surface, the metallic adhesive layer at least partially melting while it is brought into mechanical contact with the preheated surface, and
    subsequently cooling the surface to room temperature, the semiconductor chip being at least partially metallurgically bonded to the surface, and
    wherein the semiconductor chip is subsequently soldered to the surface to form a resulting solder connection.

2. The method according to claim 1, wherein the metallic adhesive layer has a solidus temperature which is ≤T1.

3. The method according to claim 1, wherein the solder compound has a solidus temperature which is >T1.

4. The method according to claim 1, further comprising applying a barrier layer between the solder compound and the metallic adhesive layer.

5. The method according to claim 4, wherein applying the barrier layer comprises vapour depositing or sputtering the barrier layer.

6. The method according to claim 4, wherein applying the barrier layer comprises depositing the barrier layer in a thickness between 10 μm and 50 μm.

7. The method according to claim 4, wherein the barrier layer comprises a material selected from the group consisting of Ti and Ni.

8. The method according to claim 1, wherein the solder compound comprises Sn or a Sn-based alloy.

9. The method according to claim 1, wherein the metallic adhesive layer comprises a material selected from the group consisting of SnIn, SnBi and In.

10. The method according to claim 1, wherein applying the solder compound comprises electroplating the solder compound on the assembling surface.

11. The method according to claim 1, wherein applying the solder compound comprises depositing the solder compound in a thickness between 20 μm and 50 μm inclusive.

12. The method according to claim 1, wherein applying the metallic adhesive layer comprises vapour depositing or sputtering the metallic adhesive layer.

13. The method according to claim 1, wherein applying the metallic adhesive layer comprises depositing the metallic adhesive layer in a thickness between 1 μm to 5 μm inclusive.

14. The method according to claim 1, wherein the surface comprises of an assembling surface of a printed circuit board or of a housing.

15. The method according to claim 1, wherein soldering is carried out in a reducing atmosphere.

16. The method according to claim 1, wherein soldering the semiconductor chip comprises soldering the semiconductor chip at a second temperature which is greater than or equal to a liquidus temperature of the solder compound.

17. The method according to claim 1, wherein the solder compound and the metallic adhesive layer melt completely during soldering, and wherein the resulting solder connection is formed, which comprises an alloy which is different in its composition from the solder compound and the metallic adhesive layer.

18. The semiconductor component comprising:
the at least one semiconductor chip mounted on the surface produced by the method according to claim 1.

19. The method according to claim 1, wherein soldering is pressure-free.

20. A method for producing a semiconductor component comprising at least one semiconductor chip mounted on a surface, wherein the semiconductor chip is fixed on the surface by:
applying a solder compound to an assembling surface of the semiconductor chip,
applying a metallic adhesive layer to a side of the solder compound facing away from the assembling surface,
preheating the surface to a first temperature T1,
bringing the metallic adhesive layer into mechanical contact in a solid state with the preheated surface, the metallic adhesive layer at least partially melting while it is brought into mechanical contact with the preheated surface, and
subsequently cooling the surface to room temperature, the semiconductor chip being at least partially metallurgically bonded to the surface, and
wherein the semiconductor chip is subsequently soldered to the surface to form a resulting solder connection,
wherein the solder compound and the metallic adhesive layer melt completely during soldering, and
wherein the resulting solder connection is formed, which comprises an alloy which is different in its composition from the solder compound and the metallic adhesive layer.

* * * * *